(12) United States Patent
Yao et al.

(10) Patent No.: US 12,513,870 B2
(45) Date of Patent: Dec. 30, 2025

(54) POWER MODULE

(71) Applicant: SEMICONDUCTOR COMPONENTS INDUSTRIES, LLC, Phoenix, AZ (US)

(72) Inventors: Yushuang Yao, Shenzhen (CN); Chee Hiong Chew, Seremban (MY); Vemmond Jeng Hung Ng, Senawang (MY); Chuncao Niu, Wuhan (CN); Sravan Vanaparthy, Phoenix, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 194 days.

(21) Appl. No.: 17/807,749

(22) Filed: Jun. 20, 2022

(65) Prior Publication Data

US 2023/0027138 A1 Jan. 26, 2023

Related U.S. Application Data

(60) Provisional application No. 63/203,433, filed on Jul. 22, 2021.

(51) Int. Cl.
*H05K 7/20* (2006.01)
*H05K 7/14* (2006.01)

(52) U.S. Cl.
CPC ....... *H05K 7/20945* (2013.01); *H05K 7/1432* (2013.01); *H05K 7/1459* (2013.01); *H05K 7/209* (2013.01)

(58) Field of Classification Search
CPC ............. H05K 7/20945; H05K 7/1432; H05K 7/1459; H05K 7/209; H05K 7/14329; H01L 23/36; H01L 25/072; H01L 23/053
(Continued)

(56) References Cited

U.S. PATENT DOCUMENTS 7,919,854 B2 * 4/2011 Stolze ................... H05K 1/141
257/E23.105
2005/0162875 A1 7/2005 Rodriguez et al.
(Continued)

FOREIGN PATENT DOCUMENTS

CN 203607394 U * 5/2014
CN 108122896 A 6/2018
(Continued)

OTHER PUBLICATIONS

Extended European Search Report dated Jun. 15, 2023 for counterpart European Patent Application No. 22185754.3, 17 pages.
(Continued)

*Primary Examiner* — Sreeya Sreevatsa
(74) *Attorney, Agent, or Firm* — Brake Hughes Bellermann LLP

(57) ABSTRACT

A method includes attaching a power electronic substrate to a bottom of a frame. The frame has a box-like rectangular shape with an open top and an open bottom. The method further includes disposing an external conductive terminal on the frame. The external conductive terminal has at least one terminal stub that extends on to the front surface of the power electronic substrate. The method further includes welding the at least one terminal stub to at least one circuit trace disposed on the front surface of the power electronic substrate.

24 Claims, 14 Drawing Sheets

(58) Field of Classification Search
USPC .......................................................... 361/142
See application file for complete search history.

(56) References Cited

U.S. PATENT DOCUMENTS

| | | |
|---|---|---|
| 2008/0158824 A1 | 7/2008 | Aoki et al. |
| 2009/0231810 A1* | 9/2009 | Liang .................... H01L 23/473 |
| | | 361/699 |
| 2010/0039774 A1 | 2/2010 | Steger et al. |
| 2011/0089568 A1 | 4/2011 | Nishibori et al. |
| 2011/0170259 A1* | 7/2011 | Miller ................ H05K 7/20927 |
| | | 361/689 |
| 2012/0008286 A1 | 1/2012 | Suzuki |
| 2013/0069210 A1* | 3/2013 | Lee ..................... H01L 23/4334 |
| | | 257/E23.042 |
| 2015/0237718 A1* | 8/2015 | Yamaguchi ............. H01L 24/00 |
| | | 361/767 |
| 2016/0155706 A1* | 6/2016 | Yoneyama .......... H01L 23/3114 |
| | | 257/77 |
| 2016/0352245 A1* | 12/2016 | Tan ........................ H01L 24/01 |
| 2017/0271273 A1 | 9/2017 | Asai et al. |
| 2017/0316993 A1* | 11/2017 | Spann .................. H01R 12/585 |

FOREIGN PATENT DOCUMENTS

| | | | |
|---|---|---|---|
| CN | 215911422 U | * | 2/2022 |
| JP | 2002184938 A | | 6/2002 |
| JP | 2004200677 A | | 7/2004 |
| JP | 2005183776 A | | 7/2005 |
| JP | 2014120592 A | | 6/2014 |
| JP | 2020022234 A | | 2/2020 |

OTHER PUBLICATIONS

Partial Search Report for counterpart EP Application No. 22185754.3, dated Dec. 8, 2022, 15 pages.

* cited by examiner

400

500

Attaching a power electronic substrate to a bottom of a frame, the frame having a box-like rectangular shape with an open top and an open bottom
510

Disposing an external conductive terminal on the frame, the external conductive terminal having at least one terminal stub that extends on to the front surface of the power electronic substrate.
520

Welding the at least one terminal stub to at least one circuit trace disposed on the front surface of the power electronic substrate
530

Attaching a power electronic substrate to a bottom of a frame, the frame having a box-like rectangular shape with an open top and an open bottom, the frame having a sidewall including a partially embedded signal pin, a bottom portion of the partially embedded signal pin being exposed to an interior of the frame
610

Wire bonding the bottom portion of the partially embedded signal pin to at least one circuit trace or device disposed on the front surface of the power electronic substrate
620

Attaching a power electronic substrate to a bottom of a frame, the frame having a box-like rectangular shape with an open top and an open bottom
710

↓

Attaching at least one signal pin with solder at a connection point on the front surface of the power electronic substrate
720

↓

Soldering a base plate to a bottom surface of the power electronic substrate attached to the bottom of the frame, the base plate absorbing at least some of a thermal load on the solder at the connection point to reduce a thermal resistance junction to solder point (Rthjs) of the solder at the connection point
730

FIG. 7

POWER MODULE

RELATED APPLICATION

This application claims the benefit of, and priority to, U.S. Provisional Patent Application No. 63/203,433, filed on Jul. 22, 2021, entitled "Power Module Design," which is hereby incorporated by reference in its entirety herein.

FIELD OF THE DISCLOSURE

The present disclosure relates to electronic power modules and more specifically to power modules that includes features for thermal management.

BACKGROUND

A power module can include a substrate to which components and devices (e.g., power transistors, power diodes, etc.) are attached (e.g., soldered). The components may be attached (e.g., soldered, sintered) as die to a top surface of the substrate. The top surface of the substrate may include metal traces to electrically connect the components. Pins may also be attached (e.g., soldered) to the traces on the substrate to provide connection points to an externally coupled electronic substrate (e.g., printed circuit board). Such pins are called soldered signal pins herein. Defects in the connection points of the soldered signal pins can prevent proper operation of the power module and/or the electronic substrate. Often these defects are a result of unmanaged temperatures at various locations in the power module which correspond to, or are indicative of, unacceptable high junction temperatures in the devices.

SUMMARY

In a general aspect, a power module includes a frame having four sidewalls. A power electronic substrate is attached to a bottom of the frame. A circuit trace and a die that are disposed on a front surface of the power electronic substrate are disposed within a cavity of the frame.

In a further aspect at least one signal pin is attached at a connection point on the front surface of the power electronic substrate, and a conductive base plate is thermally coupled to a bottom surface of the power electronic substrate attached to the bottom of the frame. The conductive base plate absorbs at least some of a thermal load at the connection point and reduces a thermal resistance junction-to-connection-point of the power module.

In a general aspect, a power module incudes a frame having a box-like rectangular shape made of four sidewalls. A power electronic substrate has at least a first portion of a front surface attached to a bottom of the frame. At least one circuit trace is disposed on a second portion of a front surface of the power electronic substrate, and an external conductive terminal is disposed on the frame. The external conductive terminal has at least a terminal stub that extends on to and is welded to the at least one circuit trace on the front surface of the power electronic substrate enclosed in the frame.

In a general aspect, a power module includes a frame having four sidewalls and a power electronic substrate attached to a bottom of the frame. At least one circuit trace is disposed on a front surface of the power electronic substrate, and at least one signal pin is at least partially embedded in one of the four sidewalls of the frame is wire bonded to a trace or device disposed on the front surface of the power electronic substrate.

In a general aspect, a method includes attaching a power electronic substrate to a bottom of a frame. The frame has a box-like rectangular shape with an open top and an open bottom. The method further includes disposing an external conductive terminal on the frame. The external conductive terminal has at least one terminal stub that extends on to the front surface of the power electronic substrate. The method further includes welding the at least one terminal stub to at least one circuit trace disposed on the front surface of the power electronic substrate.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 5 illustrates an example method for fabricating a power module.

FIG. 6. illustrates another example method for fabricating a power module.

FIG. 7 illustrates yet another example method for fabricating a power module.

The components in the drawings are not necessarily to scale relative to each other. Like reference numerals designate corresponding parts throughout the several views.

DETAILED DESCRIPTION

A power module can be packaged in a casing (housing) including at least one substrate (e.g., a power electronic substrate such as a direct bonded metal (DBM) substrate) on which circuit components and devices (e.g., insulated-gate bipolar transistor (IGBT) power devices, fast recovery diodes (FRDs), metal-oxide high-voltage DC line capacitors, main circuit bus bars, a power module drive circuit board, a motor control circuit board, three-phase current sensors, and DC and heavy-current AC connectors, etc.) are attached (e.g., soldered). The components and devices may be attached as semiconductor die (integrated circuit chips) to a top surface of the substrate. The top surface of the substrate may include metal traces and conductive pads to electrically connect the components and devices. For example, a pad on a semiconductor die of a component may be wire bonded to a metal trace on the substrate, which, in turn, may be welded to a lead frame or terminal finger providing an external connection terminal to the package. Pins (e.g., signal pins) may also be attached (e.g., soldered) to the traces on the substrate to provide external connection points to the circuit components and devices. The package casing may include a cover portion affixed (e.g., epoxied) to a base portion so that the substrate and the components are contained within a cavity (an interior volume) defined by the base portion and the cover portion. The cover portion of the casing, opposite to the base portion, may include holes through which the pins (soldered signal pins) can extend to the outside of the package to provide exterior connection points to the components and circuitry contained within the casing. After fabrication of the power module, a bottom surface of the base portion can be coupled to a heatsink by a thermally conductive material (e.g., thermal grease, etc.). In addition, the pins (e.g., signal pins that are soldered to the traces on the substrate) extending through the holes on a top surface of the cover portion of the casing can be electrically/mechanically coupled (e.g., press-fit) to vias in an electronic substrate, such as a printed circuit board (PCB).

Power module configurations that can reduce or eliminate defects in the pin connections are disclosed herein. The power module configurations can reduce or eliminate defects in pin connections, for example, by reducing the thermal resistance to heat flow from the circuits and devices enclosed in a power module package to the outside ambient of the package. The power module configurations may, for example, reduce a thermal resistance junction-to-solder-point (Rthjs) and/or reduce a thermal resistance solder-point-to-ambient (Rthsa). The reductions in these thermal resistances (Rthjs and/or Rthsa) can have a technical effect of increasing a performance (e.g., lifetime, production yield, repairs, field failures, etc.) of a power module, and a power system more generally.

Figure 1A:
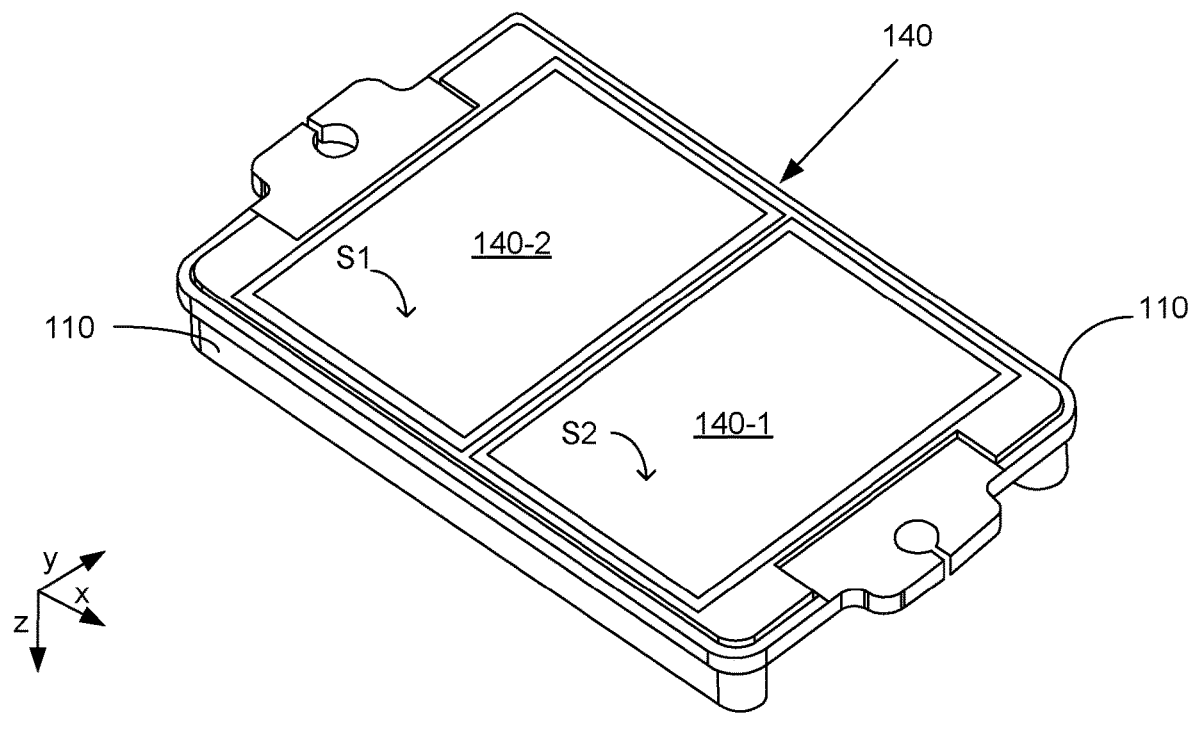
FIG. 1A illustrates a bottom view of a power module casing.
Figure 1B:
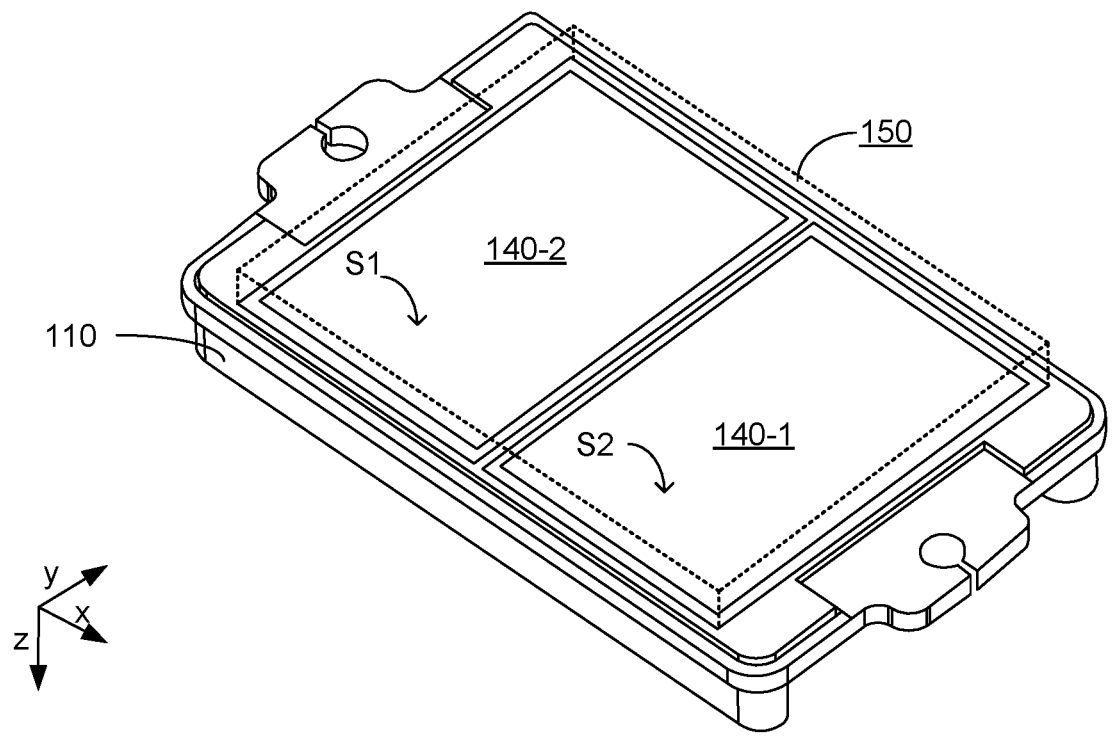
FIG. 1B illustrates a conductive base plate disposed on a backside of the power module casing of FIG. 1A.

For example, in some implementations, thermal resistance reduction can be achieved by soldering a conductive base plate to a back surface of the power electronic substrate (e.g., a DBM substrate) on a front surface of which the circuit components and devices are attached (e.g., soldered). For purposes of illustration, FIG. 1A shows a bottom view of a power module casing 110 of a power module 100 before soldering of a conductive base plate to bottom surfaces (e.g., surfaces S1 and S2) of a power electronic substrate 140 (e.g., a pair of DBM substrates 140-1 and 140-2) held in power module casing 110. Back surfaces S1 and S2, may for example, be a metal layer (e.g., a copper layer). Front surfaces (not visible) of DBM substrates 140-1 and 140-2 can be coupled to circuit components and/or devices. However, in the orientation of power module casing 110 shown in FIG. 1A, the front surfaces of the power electronic substrates (e.g., DBM substrates 140-1 and 140-2) and the circuit components and devices are hidden from view. Only the back surfaces of DBM substrates 140-1 and 140-2 (e.g., surfaces S1 and S2) are visible. For thermal resistance reduction, a conductive base plate can be soldered to the back (e.g., exposed) surfaces of DBM substrates 140-1 and 140-2. FIG. 1B shows, for example, a conductive base plate 150 disposed on the backside power module casing 110 and soldered to the back surfaces S1 and S2 of DBM substrates 140-1 and 140-2. Conductive base plate 150 may, for example, be include a solid block of a metal or metal alloy (e.g., copper). For visual clarity, in FIG. 1B, conductive base plate 150 is shown in dashed line as a transparent structure overlaying the back surfaces S1 and S2 of DBM substrates 140-1 and 140-2.

Figure 2A:
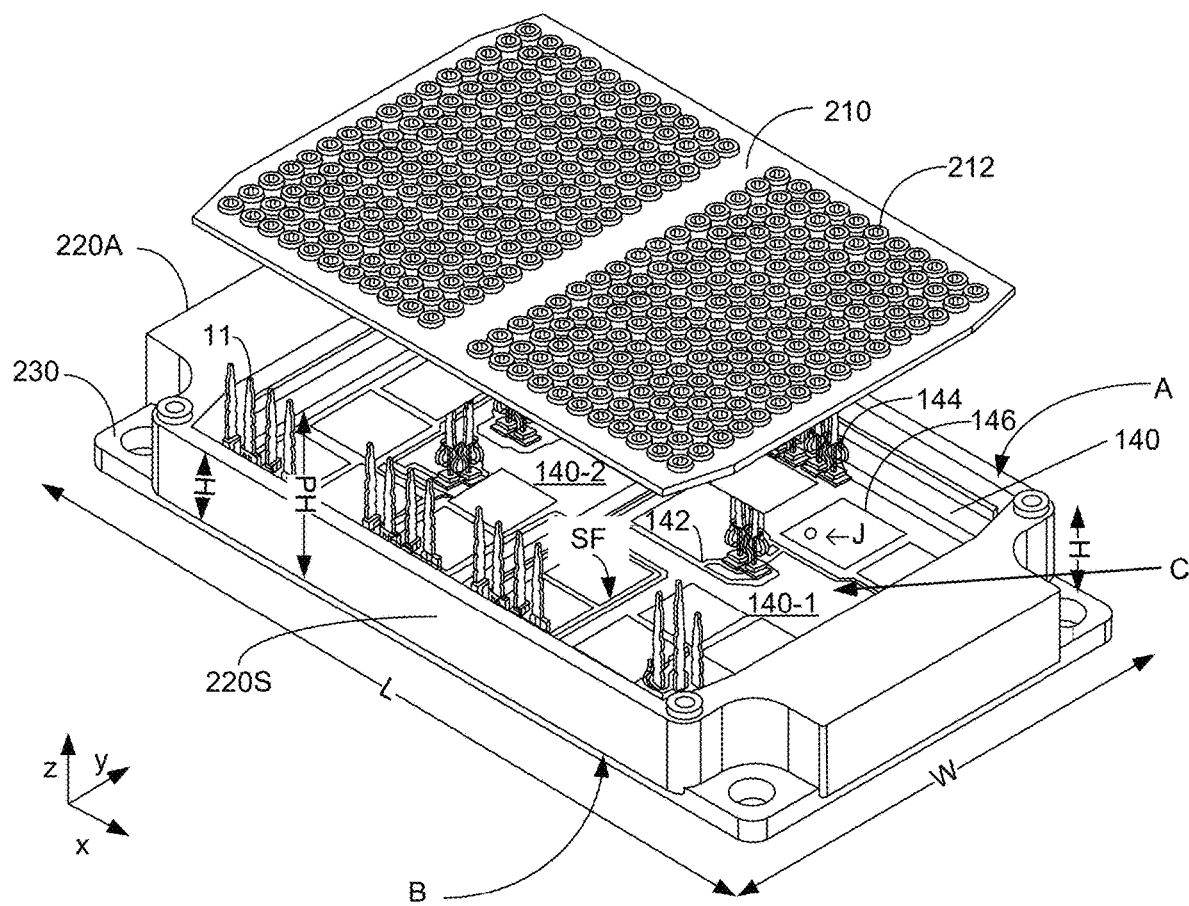
FIG. 2A illustrates an exploded view of the elements of an example power module.
Figure 2B:
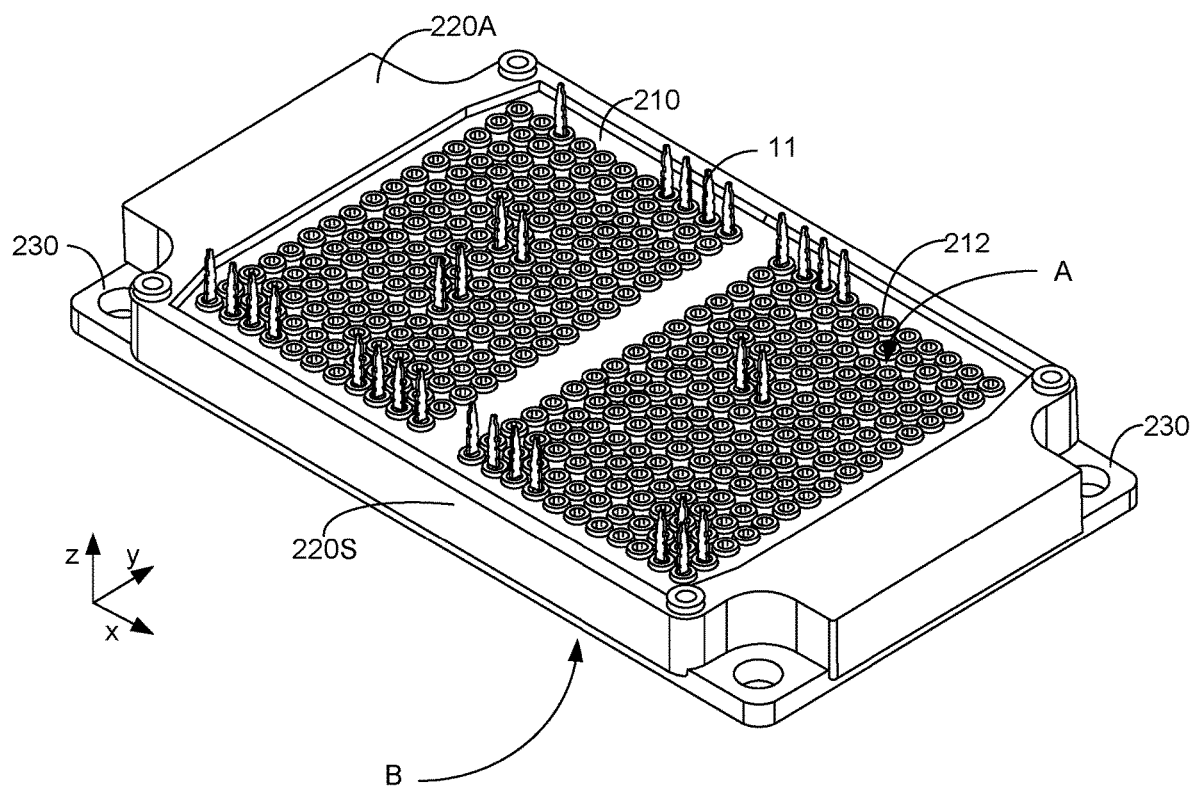
FIG. 2B illustrates a top perspective view of the power module of FIG. 2A.
Figure 2C:
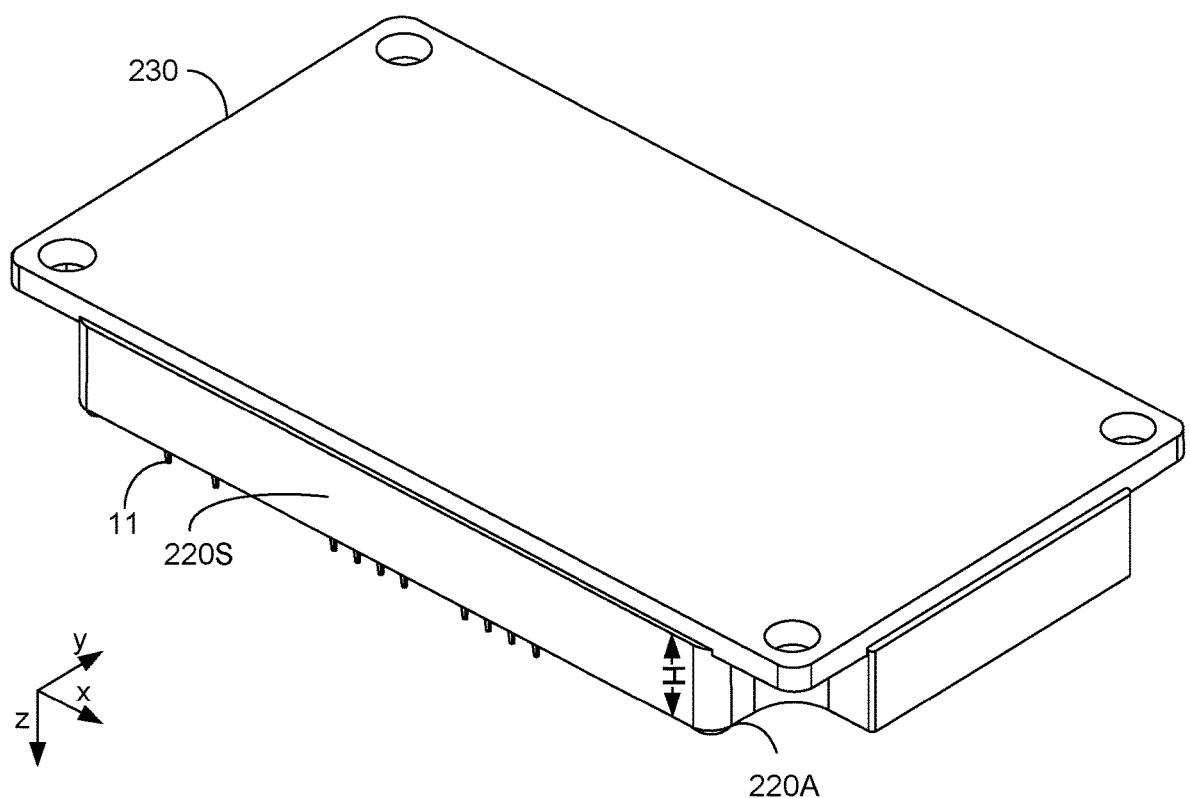
FIG. 2C illustrates a bottom perspective view of the power module of FIG. 2A.

FIGS. 2A-2C illustrate features of another example power module 200 in which a conductive base plate is soldered to the back surface of the power electronic substrate.

FIG. 2A shows an exploded view of the elements of power module 200. In power module 200, a power electronic substrate (e.g., including a pair of DBM substrates 140-1 and 140-2) is attached to a bottom of a frame 220A (e.g., a frame made of four sidewalls 220S). Frame 220A may be made of plastic, polymeric or ceramic materials. In example implementations, frame 220A may have a rectangular base length L and a rectangular base width W. Sidewalls (e.g., sidewall 220S) of frame 220A may have a height H. In example implementations, length L may be in a range of about 50 mm to 150 mm (e.g., 110 mm), width W may be in a range of about 30 mm to 80 mm (e.g., 60 mm), height H may be in a range of 5 mm to 20 mm (e.g., 10 mm).

At least a circuit trace and a die mounted on a front side of the power electronic substrate are disposed within a cavity (volume) (e.g., cavity C) in the frame below a cover plate 210 disposed over a top (e.g., top A) of the frame. A conductive base plate (e.g., base plate 230) is thermally coupled (e.g., soldered) to the bottom surfaces of the power electronic substrate (e.g., DBM substrates 140-1 and 140-2). Base plate 230 may be made of metal or metal alloy (e.g., copper). Base plate 230 may be a solid block of metal or metal alloy and may have a thickness in a range of about 2 mm to 10 mm (e.g., 3 mm).

The power electronic substrate (e.g., DBM substrates 140-1 and 140-2) may have circuit traces (e.g., trace 142) and dies (e.g., die 146) mounted on a front surface (e.g., surface SF) of the power electronic substrate. Die 146 can include a device junction (e.g., device junction J). Further, at least one signal pin (e.g., pin 11) may be attached to traces or pads on front surface SF. Pin 11 may, for example, be made of metal or metal alloy. At least one signal pin (soldered signal pin) is attached by solder at a solder point to the circuit trace and die mounted on the front surface of the power electronic substrate. The soldered signal pins (soldered signal pins 11) may, for example, be attached in a vertical orientation (e.g., along the Z axis) to front surface SF by solder (e.g., solder 144). Pins 11 may, for example, have a vertical height PH (in the Z direction) that is greater than the height H of frame sidewalls 220S. In example implementations, height PH may be in a range of about 10 mm to 30 mm (e.g., 15 mm, 20 mm). At least one soldered signal pin extends from solder 144 (i.e., the solder point) through a hole in the cover plate to an outside of the power module.

The conductive base plate (e.g., base plate 230) thermally coupled (e.g., soldered) to the bottom surfaces of the power electronic substrate may absorb at least some of a thermal load (heat) at the connection point (e.g., on solder 144 at the connection point), and thus reduce a thermal resistance junction-to-connection-point of the power module.

The circuit traces and dies (e.g., circuit trace 142, die 146) mounted on the front side SF of the power electronic substrate are disposed within a cavity (volume) (e.g., cavity C) defined by a cover plate 210 placed over a top (e.g., top A) of frame 220A and power electronic substrate 140 attached to the bottom (e.g., bottom B) of the frame. Cover plate 210 (like frame 220A) may be made of plastic, polymeric or ceramic materials. Cover plate 210 may include holes (e.g., holes 212) through which pins 11 (that a vertical height PH greater than the height H of frame sidewalls 220S) can pass through (e.g., pressure or interference fit) when cover plate 210 is placed on top of frame 220A.

FIG. 2B shows a top perspective view of power module 200 with cover plate 210 placed on top of frame 220A to enclose the power electronic substrate (not visible) in the power module. However, several signal pins (e.g., pins 11) that provide electrical connection to the circuit traces and dies of the enclosed power electronic substrate are visible in FIG. 2B as extending out of holes 212 in cover plate 210. Frame 220A rests on conductive base plate (e.g., base plate 230) soldered to the bottom surfaces of the enclosed power electronic substrate.

FIG. 2C shows a bottom perspective view of power module 200 with base plate 230 disposed on the bottom of frame 220A to enclose the power electronic substrate (not visible) in the power module. However, some of the signal pins (e.g., pins 11) that provide electrical connection to the circuits and dies of the enclosed power electronic substrate are visible in FIG. 2C as extending (in the Z direction toward a bottom of the page) further than the height H of sidewall 220S of frame 220A.

The thermal resistance reduction techniques disclosed herein are not limited to the technique of soldering a conductive base plate to a back surface of the power electronic substrate (e.g., DBM substrate) contained in a power module.

For example, in some implementations, in another thermal resistance reduction technique, external conductive terminals (e.g., lead frames) may be coupled to the exterior of the power module and may be welded at weld points to the power electronic substrate contained in the power module to reduce the thermal resistance. The external conductive terminals may have a higher conductivity, and carry more current, than signal pins (e.g., pins 11) soldered to the power electronic substrate. The external conductive terminals may replace at least some of the soldered signal pins (e.g., pins 11) that may be otherwise required to provide external connections to the circuits and dies on the power electronic substrate.

Further, for example, in some implementations, in yet another thermal resistance reduction technique, the use of soldered signal pins is avoided. Instead, signal pins that can be wire bonded to the power electronic substrate are integrated or included in the sidewalls of power module casing (frame). These signal pins that are at least partially embedded in the sidewalls may include exposed base contact pads or terminals that can be wire bonded to the circuitry and dies contained within the power module (at connection points on the power electronic substrate) to reduce thermal resistance.

In example implementations, more than one of the foregoing thermal resistance reduction techniques (e.g., two or more) can be used in combination in a power module.

Figure 3A:
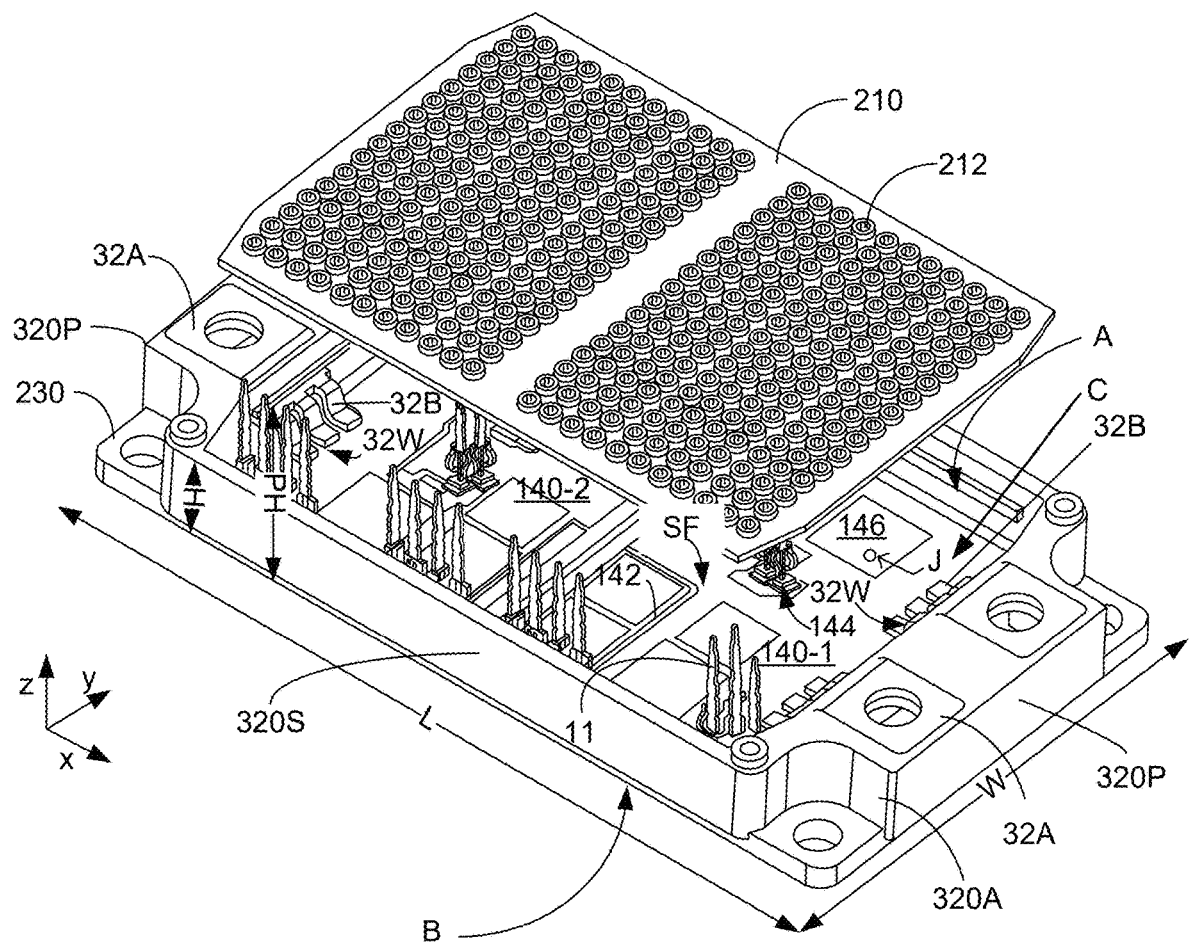
FIG. 3A illustrates an exploded view of the elements of another example power module.
Figure 3B:
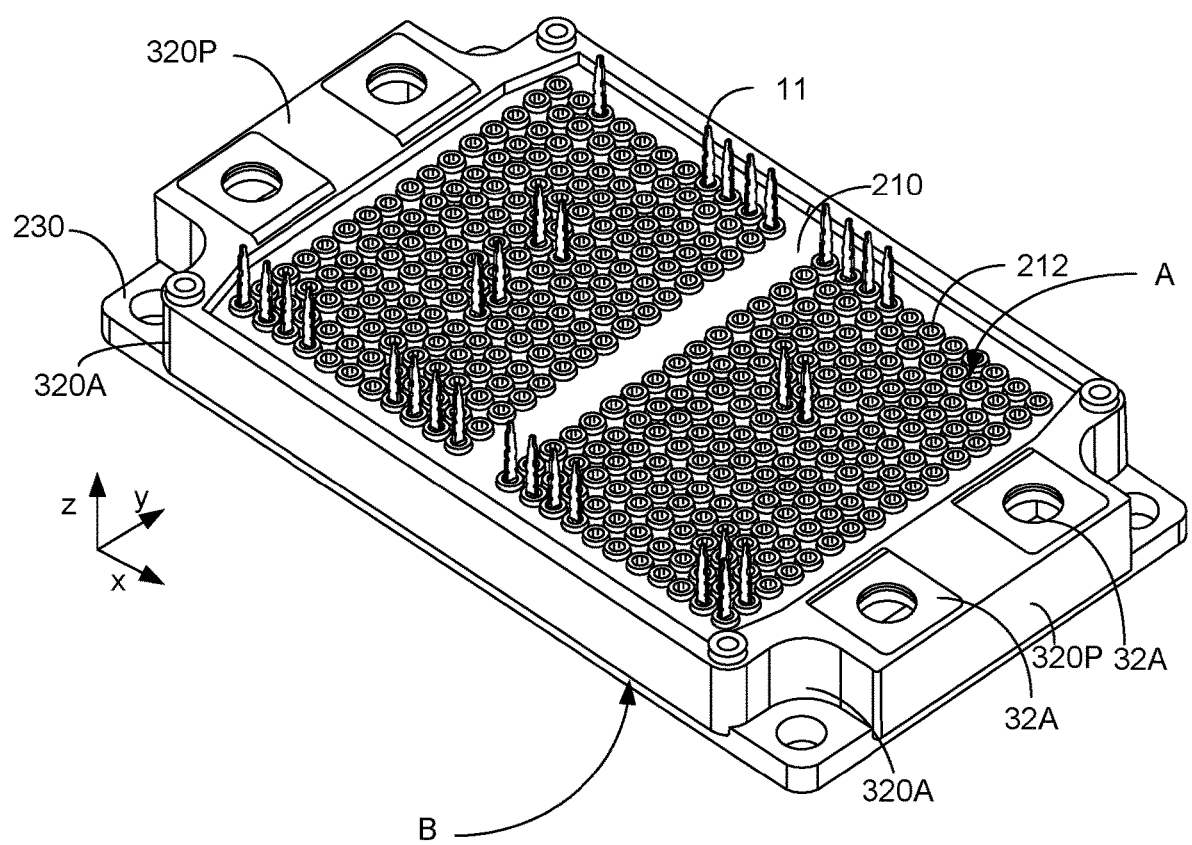
FIG. 3B illustrates a top perspective view of the power module of FIG. 3A.
Figure 3C:
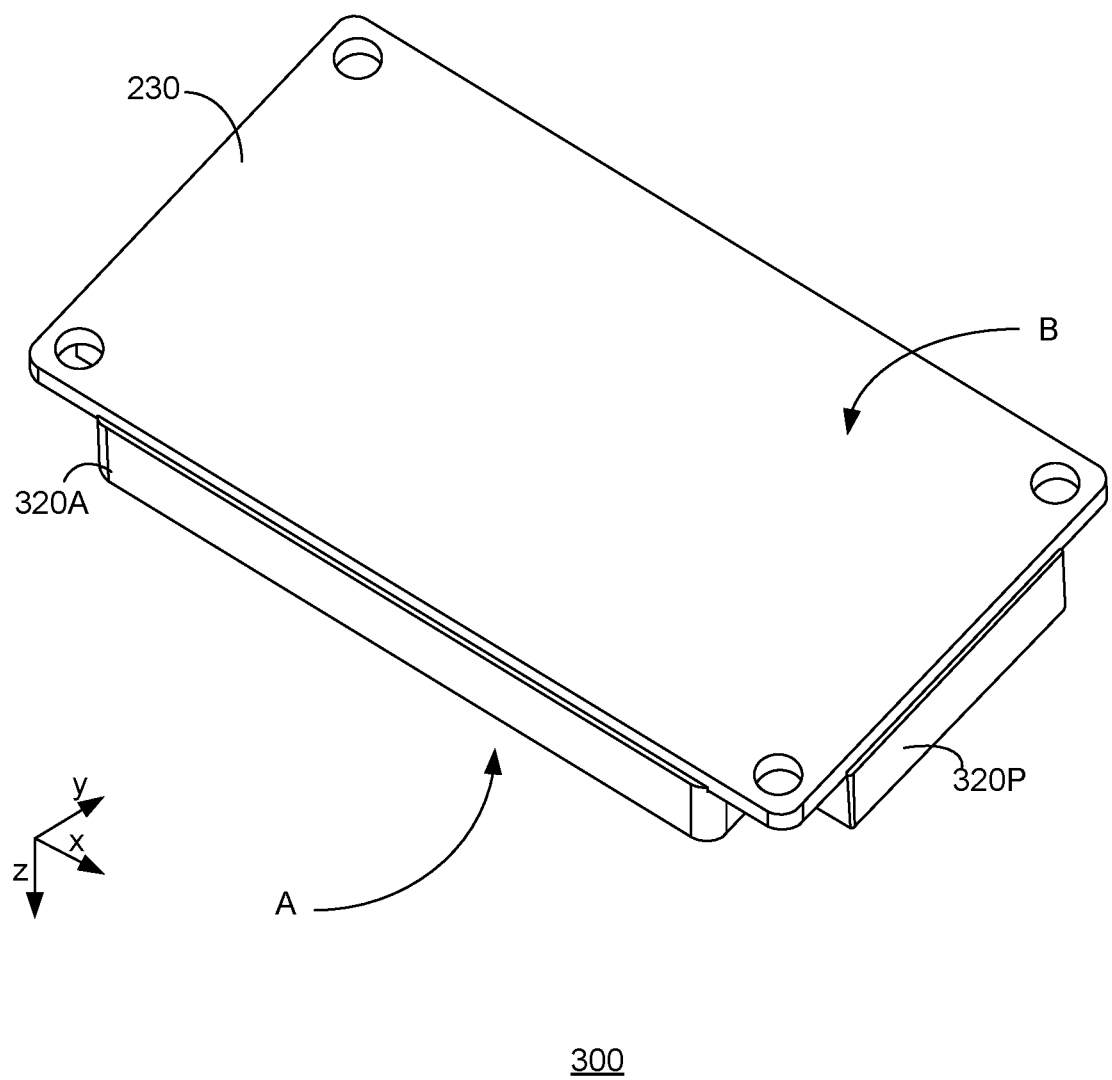
FIG. 3C illustrates a bottom perspective view of the power module of FIG. 3A.

FIGS. 3A-3C illustrate features of power module 300 in which external conductive terminals are welded to the power electronic substrate enclosed in the power module, in addition to a conductive base plate being soldered to the back surface of the power electronic substrate.

FIG. 3A shows an exploded view of the elements of power module 300. In power module 300 (as in power module 200, FIG. 2A) a power electronic substrate (e.g., including a pair of DBM substrates 140-1 and 140-2) is attached to a bottom of a frame 320A (e.g., a frame made of four sidewalls 320S). Frame 320A may be made of plastic, polymeric or ceramic materials. In example implementations, frame 320A (like frame 220A, FIG. 2A) may have a rectangular base length L and a rectangular base width W. Sidewalls (e.g., sidewall 320S) of frame 320A may have a height H.

At least one external conductive terminal 32A may be disposed on frame 320A. FIG. 3A shows, for example, four external conductive terminals 32A disposed on end portions 320P of frame 320A.

An external conductive terminal 32A may be made of metal or metal alloy, and may include terminal fingers or stubs (e.g., terminal stubs 32B) that extend on to and contact traces on the front surface (e.g., surface SF) of the power electronic substrate enclosed in power module 300, at weld points 32W. The terminal stubs 32B may be welded to the power electronic substrate at weld points 32W so that at least some current from the power electronic substrate may be carried to the exterior of power module 300 through the external conductive terminal 32A. This arrangement of external conductive terminals 32A may reduce an amount of current that flows through soldered signal pins (e.g., pins 11) in power module 300 (e.g., in contrast to the amount of current that flows through similarly soldered signal pins (e.g., pins 11) in power module 200, FIG. 2A).

For further reducing thermal resistance in power module 300, in addition to providing the external conductive terminals 32A, a conductive base plate (e.g., base plate 230) may be soldered to the bottom surfaces of the power electronic substrate (e.g., DBM substrates 140-1 and 140-2) (e.g., as in power module 200). The power electronic substrate (e.g., DBM substrates 140-1 and 140-2) may have circuit traces (e.g., trace 142) and dies (e.g., die 146) mounted on a front surface (e.g., surface SF) of the power electronic substrate. Further, at least one signal pin (e.g., pin 11) may be attached to traces or pads on front surface SF. As in power module 200, pins 11 may, for example, be made of metal or metal alloy. Pins 11 may, for example, be attached in a vertical orientation (e.g., along the Z axis) to front surface SF by solder (e.g., solder 144). Pins 11 may, for example, have a vertical height PH (in the Z direction) that is greater than the height H of frame sidewalls 320S of frame 320A.

In the example power module 300 shown in FIG. 3A, circuit traces and dies (e.g., die 146) that are mounted on the front side SF of the power electronic substrate are enclosed within a volume defined by a cover plate 210 disposed over a top of frame 320A and the power electronic substrate attached to the bottom of frame 320A. Die 146 can include a device junction (e.g., device junction J). Frame 320A (like frame 220A) may be made of plastic, polymeric or ceramic materials. Cover plate 210 may include holes (e.g., holes 212) through which pins 11 (that a vertical height PH greater than the height H of frame sidewalls 320S) can pass through when cover plate 210 is placed on top of frame 320A.

FIG. 3B shows a top perspective view of power module 300 with cover plate 210 placed on top of frame 320A to enclose the power electronic substrate (not visible) in the power module. However, external conductive terminals 32A disposed on end that provide electrical connection to the circuits and device of the enclosed power electronic substrate are visible in FIG. 3B as being disposed on end portions 320P of frame 320A. Also, several soldered signal pins (e.g., pins 11) that provide electrical connection to the circuits and device of the enclosed power electronic substrate are visible in FIG. 3B as extending out of holes 212 in cover plate 210. Frame 320A rests on conductive base plate (e.g., base plate 230) soldered to the bottom surfaces of the enclosed power electronic substrate (not visible).

FIG. 3C shows a bottom perspective view of power module 300 with base plate 230 disposed on the bottom of frame 320A to enclose the power electronic substrate (not visible) in the power module.

Figure 4A:
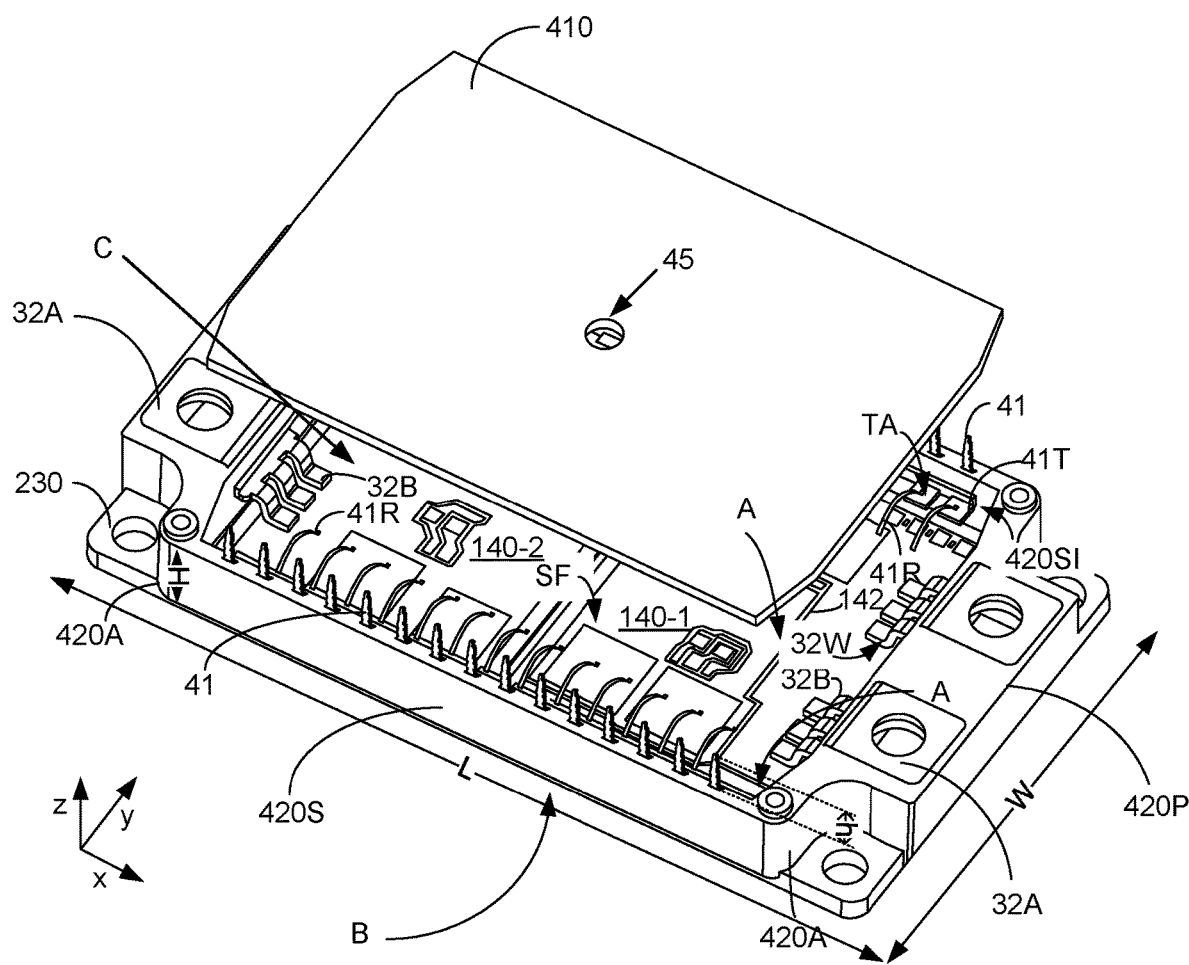
FIG. 4A illustrates an exploded view of the elements of yet another example power module.
Figure 4B:
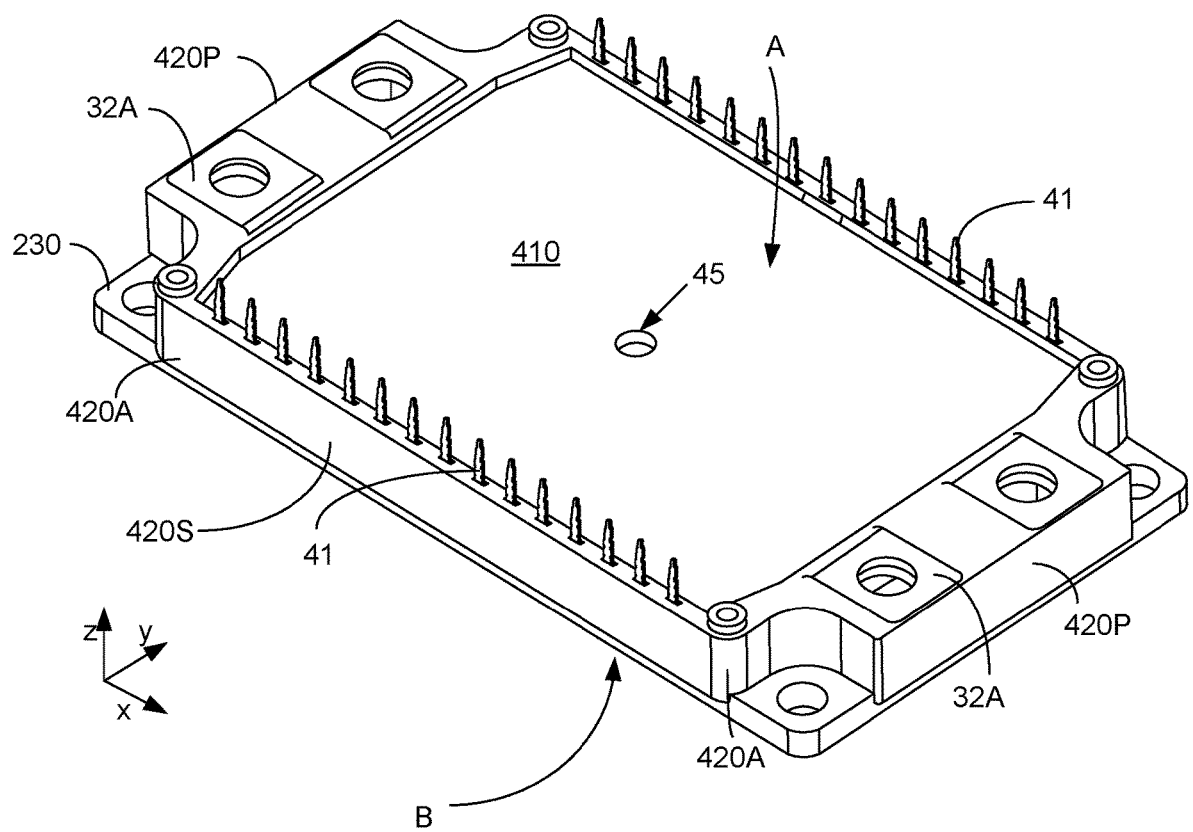
FIG. 4B illustrates a top perspective view of the power module of FIG. 4A.
Figure 4C:
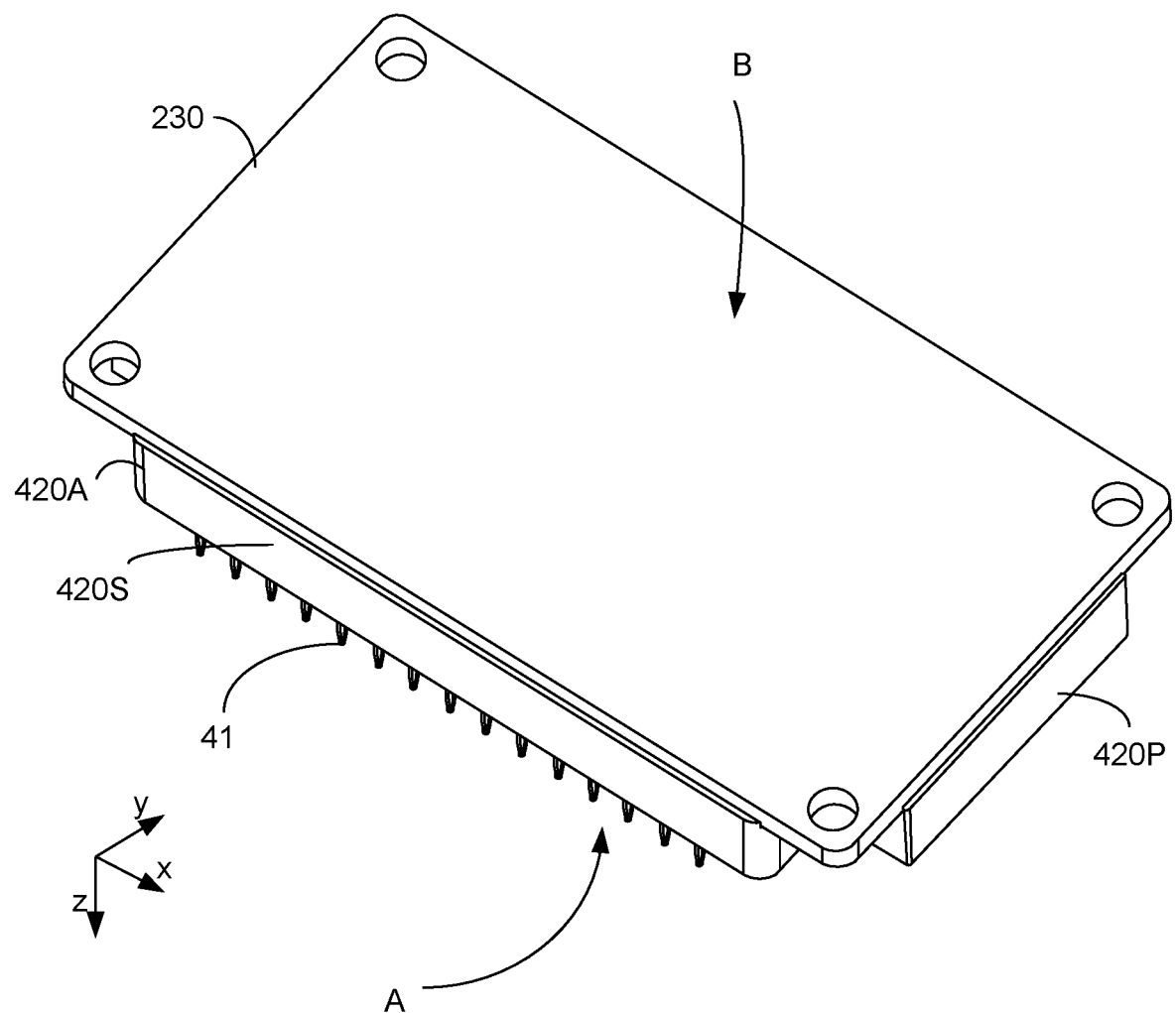
FIG. 4C illustrates a bottom perspective view of the power module of FIG. 4A.

FIGS. 4A-4C illustrate features of power module 400 in which, to reduce thermal resistance in the module, signal pins are at least partially embedded in the frame of the power module and are wire bonded to connection points on the power electronic substrate, in addition to conductive terminals being welded to the electronic substrate and a conductive base plate being soldered to the back surface of the power electronic substrate to reduce thermal resistance.

FIG. 4A shows an exploded view of the elements of power module 400. In power module 400 (as in power module 200, FIG. 2A, and power module 300, FIG. 3A) a power electronic substrate (e.g., including a pair of DBM substrates 140-1 and 140-2) is attached to a bottom of a frame 420A (e.g., a frame made of four sidewalls 420S). Frame 420A may be made of plastic, polymeric or ceramic materials. In example implementations, frame 420A (like frame 220A, FIG. 2A) may have a rectangular base length L and a rectangular base width W. Sidewalls (e.g., sidewall 420S) of frame 420A may have a height H.

In example implementations, at least one signal pin (e.g., pin 41) may be at least partially embedded in the sidewalls (e.g., sidewall 420S) of frame 420A and wire bonded to the traces or dies disposed on front surface SF of the power electronic substrate (e.g., DBM substrates 140-1 and 140-2) enclosed in the power module.

In example implementations, as shown in FIG. 4A, signal pins 41 may be molded into the longitudinal sidewalls (in other words, the sidewalls 420S extending in the x-direction along length L of the frame). A signal pin 41 may be vertically aligned (e.g., along the z direction) and a top portion of the signal pin may extend for a vertical height of about h above a top surface of sidewall 420S. A bottom portion of the signal pin may be exposed to an interior of frame 420A/power module 400 on an interior surface (e.g., interior surface 420SI) of sidewall 420S. The exposed bottom portion of the signal pin may present a wire-bondable surface (e.g., tab) to the interior of power module 400. In example implementations, the exposed bottom portion of signal pin 41 may be shaped as a wire-bondable tab (e.g., tab 41T) having an area TA. FIG. 4A shows, for example, tabs 41T having a flat rectangular or square shape with an area TA extending generally perpendicular (i.e., along the y direction) to interior surface 420SI of sidewall 420S.

Signal pins 41 may be connected to the traces or dies of the power electronic substrate (e.g., DBM substrates 140-1 and 140-2) by wires (e.g., wires 41R) bonded between tabs 41T and connections points on the traces and dies (e.g., trace 142) on the front surface (e.g., surface SF) of the power electronic substrate. The wire bonded pin connections (e.g., wires 41R) in power module 400 can have a lower thermal resistance than soldered signal pins used, for example, in power module 200 (FIG. 2A) and power module 300 (FIG. 4A).

In power module 400, soldered signal pins (e.g., pins 11 as in power module 200 and power module 300) are not used for making connection points to the traces or dies disposed on front surface SF of the power electronic substrate. All signal connections needed for operation of power module 400 and the enclosed power electronic substrate may be made using wire bonded (or welded terminal) connections.

In some example implementations, in addition to the wire-bonded signal pins 41 that are at least partially embedded in sidewalls of the frame for thermal resistance reduction, power module 400 may (as in power module 300) include external conductive terminals 32A disposed on end portions 420P of frame 420A. The external conductive terminals 32A may include terminal fingers or stubs (e.g., terminal stubs 32B that extend on to and contact traces on the front surface (e.g., surface SF) of the power electronic substrate at weld points 32W. As described above for power module 300 with reference to FIG. 3A, in power module 400 also the terminal stubs 32B may be welded to the power electronic substrate at weld points 32W so that at least some current from the power electronic substrate may be carried to the exterior of power module 400 through the external conductive terminal 32A.

In some example implementations, for further thermal resistance reduction, in addition to the wire-bonded signal pins 41 that are at least partially embedded in sidewalls of frame 420A, and the external conductive terminals 32A disposed on end portions 420P of frame 420A, power module 400 may further have a conductive base plate (e.g., base plate 230) soldered to the bottom surfaces of the power electronic substrate (e.g., DBM substrates 140-1 and 140-2).

In power module 400, circuit traces and dies (e.g., die 146) that are mounted on the front side SF of the power electronic substrate are disposed within a cavity (volume) (e.g., cavity C) defined by a cover plate 410 disposed over a top of frame 420A and the power electronic substrate attached to the bottom of frame 420A. Frame 420A, like frame 220A and frame 320A, may be made of plastic, polymeric or ceramic materials. Cover plate 410 (disposed over the top of frame 420A) may not include any special holes (e.g., holes 212, FIG. 2A) for passage of pins (e.g., pins 11) soldered to the power electronic substrate as such pins are not used in power module 400. However, as shown in FIGS. 4A and 4B, cover plate 410 may include an opening (e.g., opening 45) for other purposes (e.g., to introduce gel materials into the power module to seal or encapsulate one or more circuit components enclosed in the power module).

FIG. 4B shows a top perspective view of power module 400 with cover plate 410 placed on top of frame 420A to enclose the power electronic substrate (not visible) in the power module. However, external conductive terminals 32A disposed on end portions 420P of frame 420A that provide electrical connection to the circuits and device of the enclosed power electronic substrate are visible in FIG. 4B. Also, several signal pins (e.g., pins 41) that provide wire bonded electrical connections to the circuits and dies of the enclosed power electronic substrate are visible in FIG. 4B as extending out of sidewalls (e.g., sidewall 40S) of frame 420A (e.g., in the vertical z direction). Frame 420A rests on a conductive base plate (e.g., base plate 230) soldered to the bottom surfaces of the enclosed power electronic substrate.

FIG. 4C shows a bottom perspective view of power module 400 with base plate 230 disposed on the bottom of frame 420A to enclose the power electronic substrate (not visible) in the power module.

FIG. 5 illustrates a method 500 for fabricating a power module having a reduced thermal resistance junction-to-solder-point (Rthjs) and/or a reduced a thermal resistance solder point to ambient (Rthsa).

Method 500 includes attaching a power electronic substrate to a bottom of a frame (510), The frame is made of four side walls. At least one circuit trace is disposed on a front surface of the power electronic substrate. Method 500 further involves disposing an external conductive terminal on the frame (520). The external conductive terminal has at least one terminal stub that extends on to the front surface of the power electronic substrate. Method 500 further includes welding the at least one terminal stub to the at least one circuit trace disposed on the front surface of the power electronic substrate (530).

FIG. 6 illustrates another method 600 for fabricating a power module having a reduced thermal resistance junction-to-solder-point (Rthjs) and/or a reduced a thermal resistance solder-point-to-ambient (Rthsa).

Method 600 includes attaching a power electronic substrate to a bottom of a frame (610). The frame has at least a sidewall including a partially embedded signal pin, a bottom portion of the partially embedded signal pin being exposed to an interior of the frame.

Method 600 further includes wire bonding the bottom portion of the partially embedded signal pin to at least one circuit trace or device disposed on the front surface of the power electronic substrate (620).

FIG. 7 illustrates yet another method 700 for fabricating a power module having a reduced thermal resistance junction-to-solder-point (Rthjs) and/or a reduced thermal resistance solder-point-to-ambient (Rthsa).

Method 700 includes attaching a power electronic substrate to a bottom of a frame, the frame having four sidewalls (710) and attaching at least one signal pin with solder at a solder point on the front surface of the power electronic substrate (720).

Method 700 further includes soldering a base plate to a bottom surface of the power electronic substrate attached to the bottom of the frame, the base plate absorbing at least some of a thermal load on the solder at the solder point to reduce a thermal resistance junction-to-solder-point (Rthjs) of the solder at the solder point (730). The base plate may be a solid block of a metal or a metal alloy.

In FIG. 1A through FIG. 7, portions described with terms like upper, top, etc. refer to portions that are nearer to the top of the page than portions specified with terms like lower, bottom, etc. Likewise, portions described with terms like left are nearer to the left side of the page than portions described with terms like right. It should be recognized that these descriptions represent a chosen frame of reference that is not intended to be limiting because almost any other frame of reference can be used to describe the portions.

The power module frames and covers may be fabricated from a first material (i.e., casing material), which can be selected based on properties, such as electrical isolation and compatibility with fabrication (e.g., compatibility with an injection molding process). For example, the casing material can be a thermoplastic polymer, such as polybutylene terephthalate (PBT). PBT may have a first coefficient of thermal expansion (CTE) that is in a range of about $30 \times 10\text{-}6$ to $100 \times 10\text{-}6$ per Kelvin (K-1) (i.e., 30-100 ppm/K).

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It will be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising", and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

The invention claimed is:

1. A power module, comprising:
a frame having a base and at least one sidewall extending from the base of the frame and defining a cavity;
a power electronic substrate attached to the base of the frame, a circuit trace and a die disposed on a front surface of the power electronic substrate within the cavity of the frame, the die including a device junction, a bottom surface of the power electronic substrate being exposed through an opening in the base of the frame;

at least one signal pin directly attached to a connection point on the front surface of the power electronic substrate;
an external conductive terminal disposed on a top surface of a sidewall of the frame; and
a conductive base plate thermally coupled to the bottom surface of the power electronic substrate exposed through the opening in the base of the frame, the conductive base plate absorbing at least some of a thermal load at the connection point and reducing a device junction-to-connection point thermal resistance of the power module.

2. The power module of claim 1, further comprising:
a cover plate disposed on a top of the frame.

3. The power module of claim 2, wherein the at least one signal pin and the external conductive terminal extend through a respective hole in the cover plate to an outside of the power module.

4. The power module of claim 1, wherein the frame is made of plastic, polymeric or ceramic materials.

5. The power module of claim 1, wherein the frame is made of polybutylene terephthalate (PBT).

6. The power module of claim 1, wherein the frame has a rectangular base length L in a range of about 50 mm to 150 mm, a rectangular base width W in a range of about 30 mm to 80 mm, and four sidewalls, each of the four sidewalls having a height H in a range of 5 mm to 20 mm.

7. The power module of claim 1, wherein the conductive base plate is a solid block of metal or metal alloy and has a thickness in a range of about 2 mm to 10 mm.

8. The power module of claim 1, wherein the conductive base plate is directly attached to the bottom surface of the power electronic substrate.

9. The power module of claim 1, wherein the conductive base plate is soldered to the bottom surface of the power electronic substrate.

10. A power module, comprising:
a frame having a box-like rectangular shape made of a base and a sidewall extending from the base and defining a cavity; and
a power electronic substrate directly attached to the base of the frame with a front surface of the power electronic substrate being exposed to the cavity and at least one circuit trace disposed on the front surface of the power electronic substrate, the power electronic substrate including a device junction, wherein a bottom surface of the power electronic substrate is exposed through an opening in the base of the frame.

11. The power module of claim 10, further comprising an external conductive terminal disposed on a top surface of the sidewall of the frame, the external conductive terminal connected to at least a terminal stub that extends on to and is connected directly to the at least one circuit trace on the front surface of the power electronic substrate, wherein the external conductive terminal is made of a metal or a metal alloy.

12. The power module of claim 11, wherein the terminal stub is welded at a weld point to the at least one circuit trace so that at least some current from the power electronic substrate is carried to an exterior of the power module through the external conductive terminal.

13. The power module of claim 10, further comprising:
at least one signal pin attached by a solder at a solder point to the front surface of the power electronic substrate.

14. The power module of claim 13, further comprising:
a conductive base plate thermally coupled to the bottom surface of the power electronic substrate exposed through the opening in the frame, the conductive base plate absorbing at least some of a thermal load on the solder at the solder point to reduce a device junction-to-solder-point thermal resistance of the power module.

15. The power module of claim 10, further comprising:
at least one signal pin that is at least partially embedded in a sidewall of the frame and wire bonded to a trace or device disposed on the front surface of the power electronic substrate.

16. A power module, comprising:
a frame having a base and four sidewalls extending from the base and defining a cavity;
a power electronic substrate attached to the base of the frame, the power electronic substrate having a front surface exposed within the cavity with at least one circuit trace disposed on the front surface of the power electronic substrate, junction wherein a bottom surface of the power electronic substrate is exposed through an opening in the base of the frame;
an external conductive terminal having a horizontal orientation disposed on a top surface of a sidewall of the frame; and
at least one signal pin that is at least partially embedded in one of the four sidewalls of the frame and wire bonded to a trace or device disposed on the front surface of the power electronic substrate.

17. The power module of claim 16, wherein the at least one signal pin that is at least partially embedded in one of the four sidewalls of the frame has a bottom portion that is exposed to an interior of the power module.

18. The power module of claim 16, wherein the at least one signal pin that is at least partially embedded one of the four sidewalls of the frame has a bottom portion that is shaped as a wire-bondable tab.

19. The power module of claim 16, further comprising:
at least one other signal pin attached by a solder at a solder point to the front surface of the power electronic substrate.

20. The power module of claim 19, further comprising:
a conductive base plate thermally coupled to the bottom surface of the power electronic substrate exposed through the opening in the frame, the conductive base plate absorbing at least some of a thermal load on the solder at the solder point to reduce a device junction-to-solder-point thermal resistance of the power module.

21. The power module of claim 16, wherein the external conductive terminal is connected to at least a terminal stub that extends on to and is directly connected to a circuit trace disposed on the front surface of the power electronic substrate.

22. A method, comprising:
attaching a power electronic substrate to a base of a frame in a power module, the frame having at least one sidewall extending from the base of the frame, at least one circuit trace disposed on a front surface of the power electronic substrate, the power electronic substrate including a device junction, wherein a bottom surface of the power electronic substrate is exposed through an opening in the base of the frame;
disposing an external conductive terminal disposed on a top of the at least one sidewall the frame, the external conductive terminal connected to at least one terminal stub that extends on to the front surface of the power electronic substrate; and
connecting the at least one terminal stub directly on to the at least one circuit trace disposed on the front surface of the power electronic substrate.

23. The method of claim 22, wherein the at least one sidewall of the frame includes a partially embedded signal pin, a bottom portion of the partially embedded signal pin being exposed to an interior of the frame,
the method further comprises:
wire bonding the bottom portion of the partially embedded signal pin to the at least one circuit trace.

24. The method of claim 22, further comprising:
attaching at least one signal pin with solder at a connection point on the front surface of the power electronic substrate; and
soldering a base plate to a bottom surface of the power electronic substrate the base plate absorbing at least some of a thermal load on the solder at the connection point to reduce a device junction-to-connection-point thermal resistance in the power module.

* * * * *